(12) United States Patent
Hu et al.

(10) Patent No.: US 11,222,986 B2
(45) Date of Patent: Jan. 11, 2022

(54) SEMICONDUCTOR DEVICE WITH AN INTEGRATED DEEP TRENCH CAPACITOR HAVING HIGH CAPACITANCE DENSITY AND LOW EQUIVALENT SERIES RESISTANCE

(71) Applicant: TEXAS INSTRUMENTS INCORPORATED, Dallas, TX (US)

(72) Inventors: Binghua Hu, Plano, TX (US); Yanbiao Pan, Plano, TX (US); Django Trombley, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/939,823

(22) Filed: Jul. 27, 2020

(65) Prior Publication Data
US 2021/0028316 A1 Jan. 28, 2021

Related U.S. Application Data

(60) Provisional application No. 62/878,771, filed on Jul. 26, 2019.

(51) Int. Cl.
*H01L 29/94* (2006.01)
*H01L 29/66* (2006.01)

(52) U.S. Cl.
CPC ...... *H01L 29/945* (2013.01); *H01L 29/66181* (2013.01)

(58) Field of Classification Search
CPC .................. H01L 29/945; H01L 29/66181
See application file for complete search history.

(56) References Cited

U.S. PATENT DOCUMENTS

| | | | |
|---|---|---|---|
| 6,703,273 B2 | 3/2004 | Wang et al. | |
| 2009/0174031 A1* | 7/2009 | Wang | G11C 11/404 257/532 |
| 2016/0181353 A1* | 6/2016 | Ando | H01L 23/26 257/534 |
| 2019/0051721 A1 | 2/2019 | Hu et al. | |

\* cited by examiner

*Primary Examiner* — Wasiul Haider
(74) *Attorney, Agent, or Firm* — Jacqueline J. Garner; Charles A. Brill; Frank D. Cimino

(57) ABSTRACT

A semiconductor device includes an integrated trench capacitor in a substrate, with a field oxide layer on the substrate. The trench capacitor includes trenches extending into semiconductor material of the substrate, and a capacitor dielectric in the trenches on the semiconductor material. The trench capacitor further includes an electrically conductive trench-fill material on the capacitor dielectric. A portion of the capacitor dielectric extends into the field oxide layer, between a first segment of the field oxide layer over the trench-fill material and a second segment of the field oxide layer over the semiconductor material. The integrated trench capacitor has a trench contact to the trench-fill material in each of the trenches, and substrate contacts to the semiconductor material around the trenches, with no substrate contacts between the trenches.

20 Claims, 12 Drawing Sheets

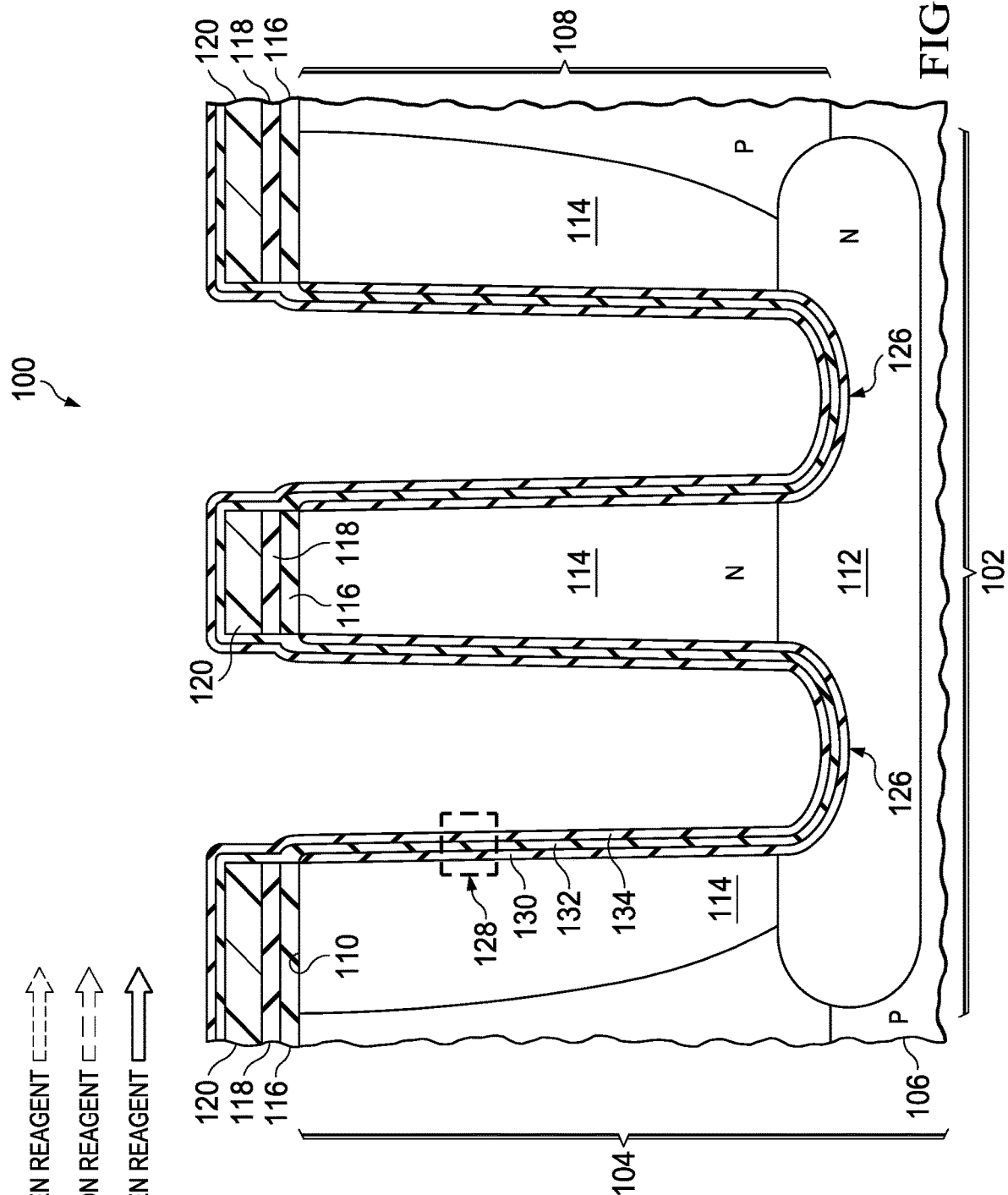

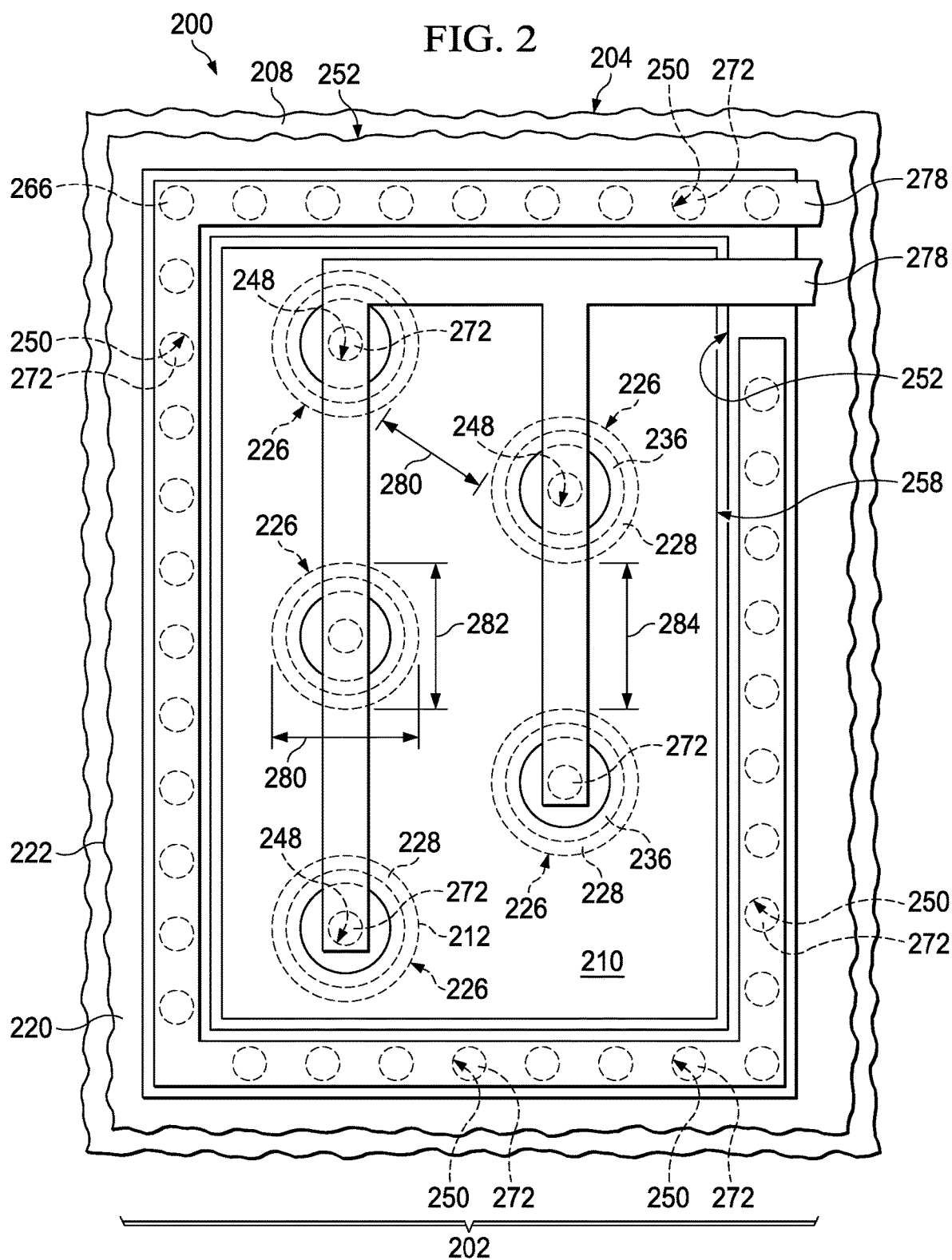

SEMICONDUCTOR DEVICE WITH AN INTEGRATED DEEP TRENCH CAPACITOR HAVING HIGH CAPACITANCE DENSITY AND LOW EQUIVALENT SERIES RESISTANCE

CROSS-REFERENCE TO RELATED APPLICATIONS

This application claims the benefit of priority under 35 U.S.C. § 119(e) of U.S. Provisional Application No. 62/878,771, filed Jul. 26, 2019, which is hereby incorporated by reference in its entirety.

FIELD

This disclosure relates to the field of semiconductor devices. More particularly, but not exclusively, this disclosure relates to trench capacitors in semiconductor devices.

BACKGROUND

Trench capacitors have been formed in semiconductor devices, but typically require added photolithographic steps. Moreover, improving capacitance density and equivalent series resistance has been challenging. Improvements in integrating trench capacitors into semiconductor device process flows are needed.

SUMMARY

The present disclosure introduces a semiconductor device including an integrated trench capacitor, hereinafter the trench capacitor, in a substrate of the semiconductor device. The semiconductor device has a field oxide layer on the substrate. The trench capacitor includes a plurality of trenches extending into the substrate. The trench capacitor includes a capacitor dielectric on a semiconductor material of the substrate, and an electrically conductive trench-fill material on the capacitor dielectric. The field oxide layer extends between the trenches and covers a portion of the trench-fill material in each of the trenches. A portion of the capacitor dielectric extends between a first segment of the field oxide layer and a second segment of the field oxide layer. The first segment is located over the trench-fill material in each trench. The second segment is located over the semiconductor material of the substrate. The integrated trench capacitor has a trench contact to the trench-fill material in each of the trenches, and substrate contacts to the semiconductor material around the trenches, with no substrate contacts between the trenches.

BRIEF DESCRIPTION OF THE VIEWS OF THE DRAWINGS

FIG. 1A through FIG. 1K are cross sections of an example semiconductor device with a trench capacitor, depicted in successive stages of an example method of formation.

FIG. 2 discloses a top down view of the layout of a semiconductor device containing trench capacitor.

DETAILED DESCRIPTION

Figure 1A:
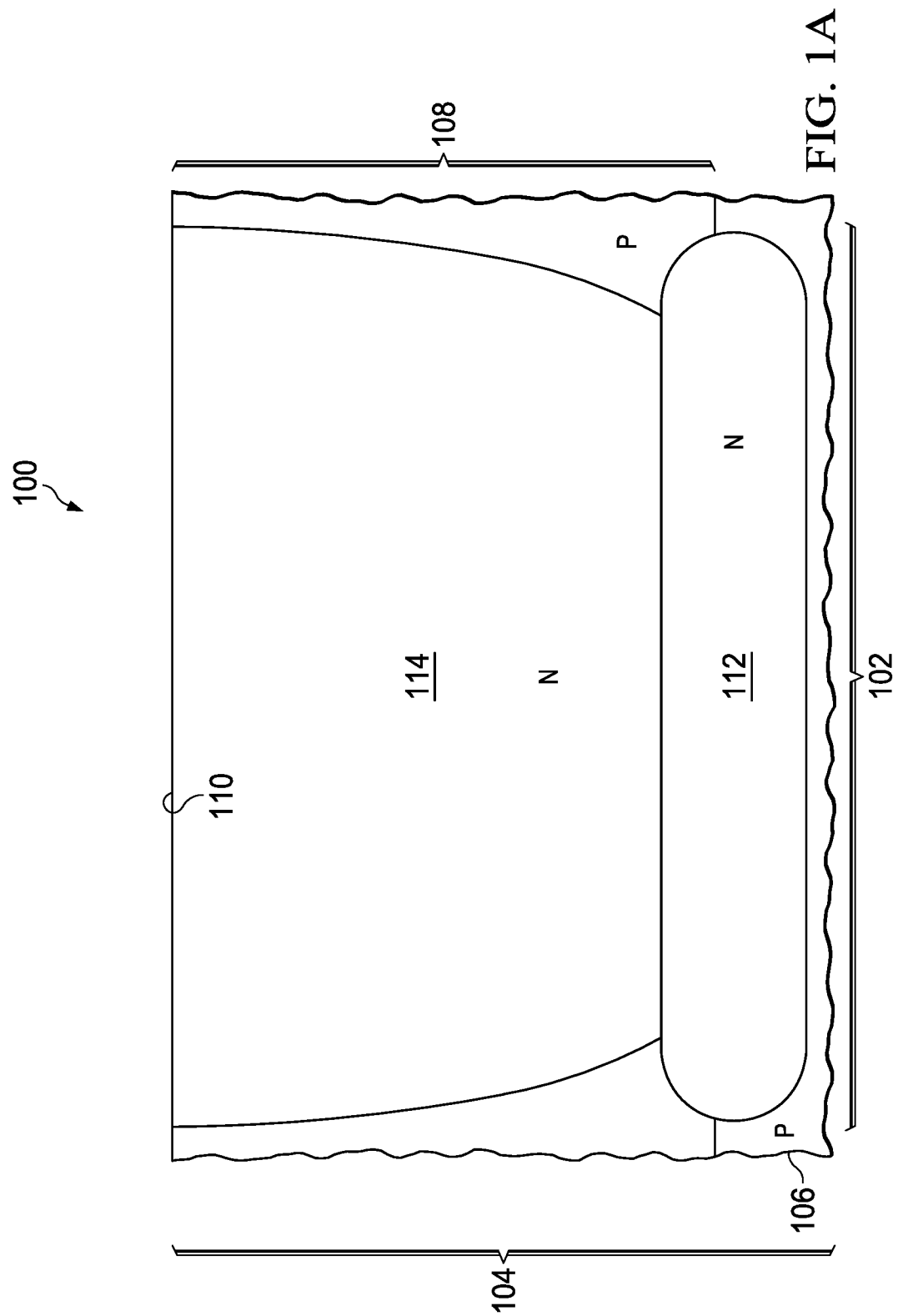

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device is formed in and on a substrate having a semiconductor material 108. The semiconductor device includes a trench capacitor in the substrate. The trench capacitor includes a plurality of trenches extending into the semiconductor material 108. The trench capacitor also includes a capacitor dielectric in each trench, contacting the semiconductor material 108. The capacitor dielectric includes a silicon-nitrogen compound. The trench capacitor further includes an electrically conductive trench-fill material on the capacitor dielectric in each trench. The trench-fill material provides a first plate of the trench capacitor, and the semiconductor material 108 contacting the trenches provides a second plate of the trench capacitor.

The semiconductor device has a field oxide layer on the semiconductor material 108, extending between the trenches. The field oxide layer also covers a portion of the trench-fill material in each of the trenches, with a trench contact opening over the trench-fill material in each trench. The trench-fill material extends through each trench contact opening. A metal silicide layer is located on the trench-fill material in each trench contact opening. A silicide blocking layer is located over the field oxide layer, overlapping the capacitor dielectric. The silicide blocking layer is free of the metal silicide layer. The trench capacitor is free of the metal silicide layer between the trenches. The trench capacitor includes substrate contacts to the semiconductor material 108 on at least two opposite sides of the plurality of the trenches. The substrate contacts provide electrical connections to the semiconductor material 108.

It is noted that terms such as top, over, above, under, and below may be used in this disclosure. These terms should not be construed as limiting the position or orientation of a structure or element, but should be used to provide spatial relationship between structures or elements.

FIG. 1A through FIG. 1K are cross sections of an example semiconductor device 100 with a trench capacitor 102, depicted in successive stages of an example method of formation. Referring to FIG. 1A, the semiconductor device 100 is formed in and on a substrate 104. In this example, the substrate 104 may include a base wafer 106, such as a silicon wafer. The base wafer 106 may have a first conductivity type, which may be p-type in this example, as indicated in FIG. 1A. In an alternate version of this example, the base wafer 106 may include a dielectric material, such as silicon dioxide or sapphire, to provide a silicon-on-insulator substrate. The substrate 104 of this example also includes a semiconductor material 108 formed on the base wafer 106. The semiconductor material 108 includes primarily silicon, and may consist essentially of silicon and dopants, such as boron. The semiconductor material 108 may be formed by an epitaxial process. The semiconductor material 108 extends to a top surface 110 of the substrate 104, located on an opposite surface of the semiconductor material 108 from a boundary between the semiconductor material 108 and the base wafer 106. In this example, the semiconductor material 108 may have the first conductivity type, that is, p-type, as indicated in FIG. 1A. The semiconductor material 108 may be 5 microns to 15 microns thick, by way of example.

A buried layer 112 may be formed in the substrate 104, extending into both the base wafer 106 and the semiconductor material 108. The buried layer 112 has a second conductivity type, opposite from the first conductivity type. In this example, the second conductivity type is n-type, as indicated in FIG. 1A. The buried layer 112 may be formed by implanting dopants of the second conductivity type, such as phosphorus, arsenic, or antimony, into the base wafer 106 before the semiconductor material 108 is formed. The base wafer 106 may be annealed prior to forming the semiconductor material 108, and the semiconductor material 108 may subsequently be formed by an epitaxial process of thermal decomposition of silane, during which the dopants of the second conductivity type diffuse deeper into the base wafer 106 and into the semiconductor material 108, forming the buried layer 112.

A deep well 114 may be formed in the semiconductor material 108, extending from the top surface 110 of the substrate 104 to the buried layer 112. The deep well 114 may have the second conductivity type, n-type in this example, as indicated in FIG. 1A. The deep well 114 may be formed by implanting dopants of the second conductivity type, such as phosphorus, into the semiconductor material 108, followed by a thermal drive to diffuse the implanted dopants to the buried layer 112 and activate the implanted dopants. The deep well 114 may have an average concentration of the dopants of the second conductivity type that is 2 to 10 times greater than an average concentration of dopants of the first conductivity type in the semiconductor material 108 outside of the deep well 114.

In another version of this example, the deep well 114 may have the first conductivity type, and may have an average concentration of the dopants of the first conductivity type that is 2 to 10 times greater than an average concentration of dopants of the first conductivity type in the semiconductor material 108 outside of the deep well 114. In a further version, the buried layer 112 may be omitted. In yet another version, both the deep well 114 and the buried layer 112 may be omitted.

Figure 1B:
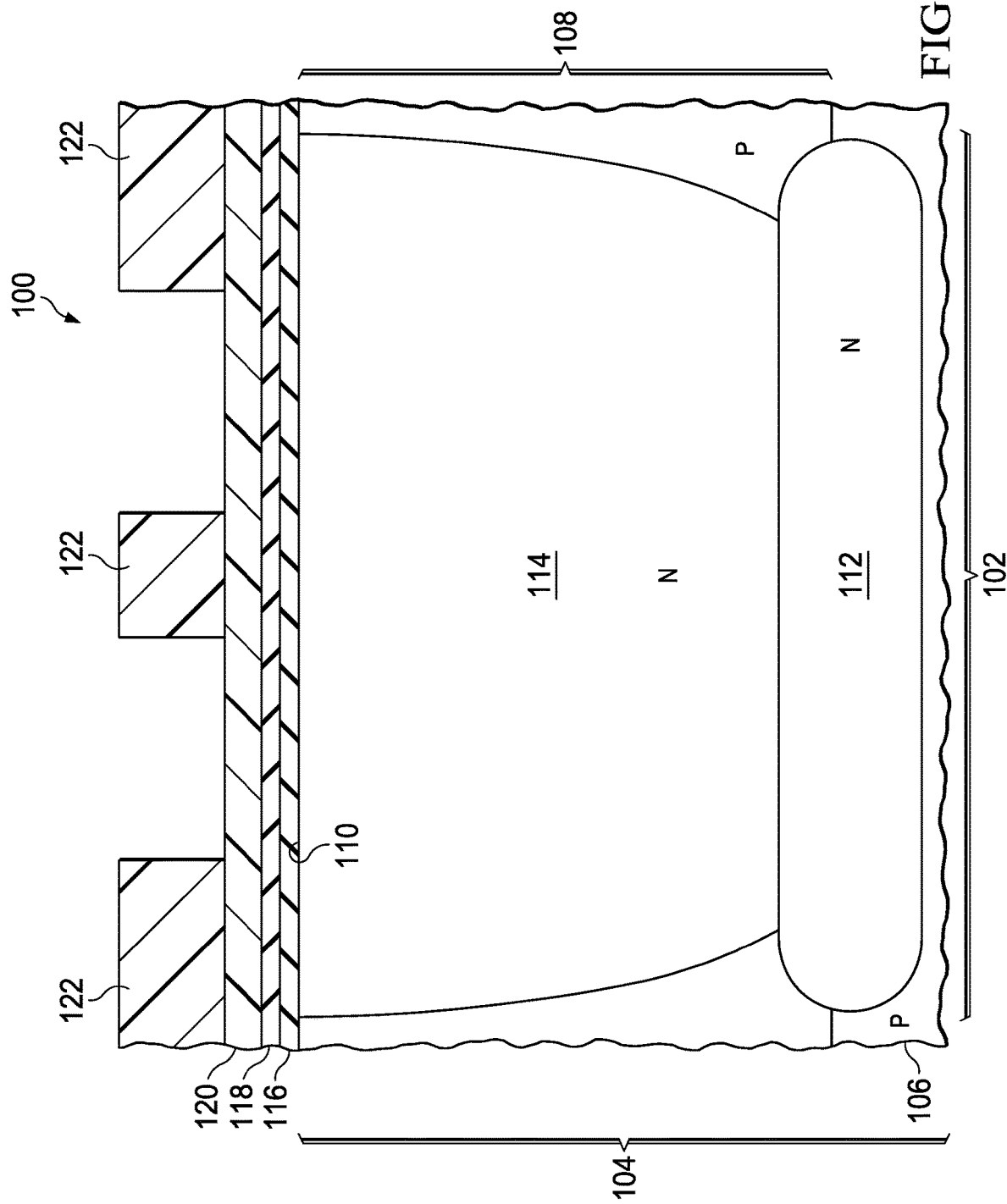

Referring to FIG. 1B, a pad oxide layer 116 may be formed on the top surface 110 of the substrate 104. The pad oxide layer 116 may include primarily silicon dioxide, may be formed by a thermal oxidation process or a thermal chemical vapor deposition (CVD) process, and may have a thickness of 50 nanometers to 200 nanometers, by way of example. A nitride cap layer 118 may be formed on the pad oxide layer 116. The nitride cap layer 118 may include primarily silicon nitride, may be formed by a low pressure chemical vapor deposition (LPCVD) furnace process, and may have a thickness of 100 nanometers to 500 nanometers, for example. A hard mask layer 120 may be formed on the nitride cap layer 118. The hard mask layer 120 may include primarily silicon dioxide, may be formed by a plasma enhanced chemical vapor deposition (PECVD) process, and may have a thickness of 1 micron to 3 microns, depending on a depth of subsequently-formed trenches 126, shown in FIG. 1C. The pad oxide layer 116 may provide stress relief between the semiconductor material 108 and a combination of the nitride cap layer 118 and the hard mask layer 120. The nitride cap layer 118 may provide a stop layer for subsequent etch and planarization processes. The hard mask layer 120 may provide a hard mask during a subsequent trench etch process to form the trenches 126. Next, a trench mask 122 may be formed on the hard mask layer 120 with openings which expose the hard mask layer 120 in areas for the trenches 126. The trench mask 122 may include photoresist, and may optionally include anti-reflection material such as a bottom anti-reflection coat (B ARC). The trench mask 122 may be formed by a photolithographic process.

Figure 1C:
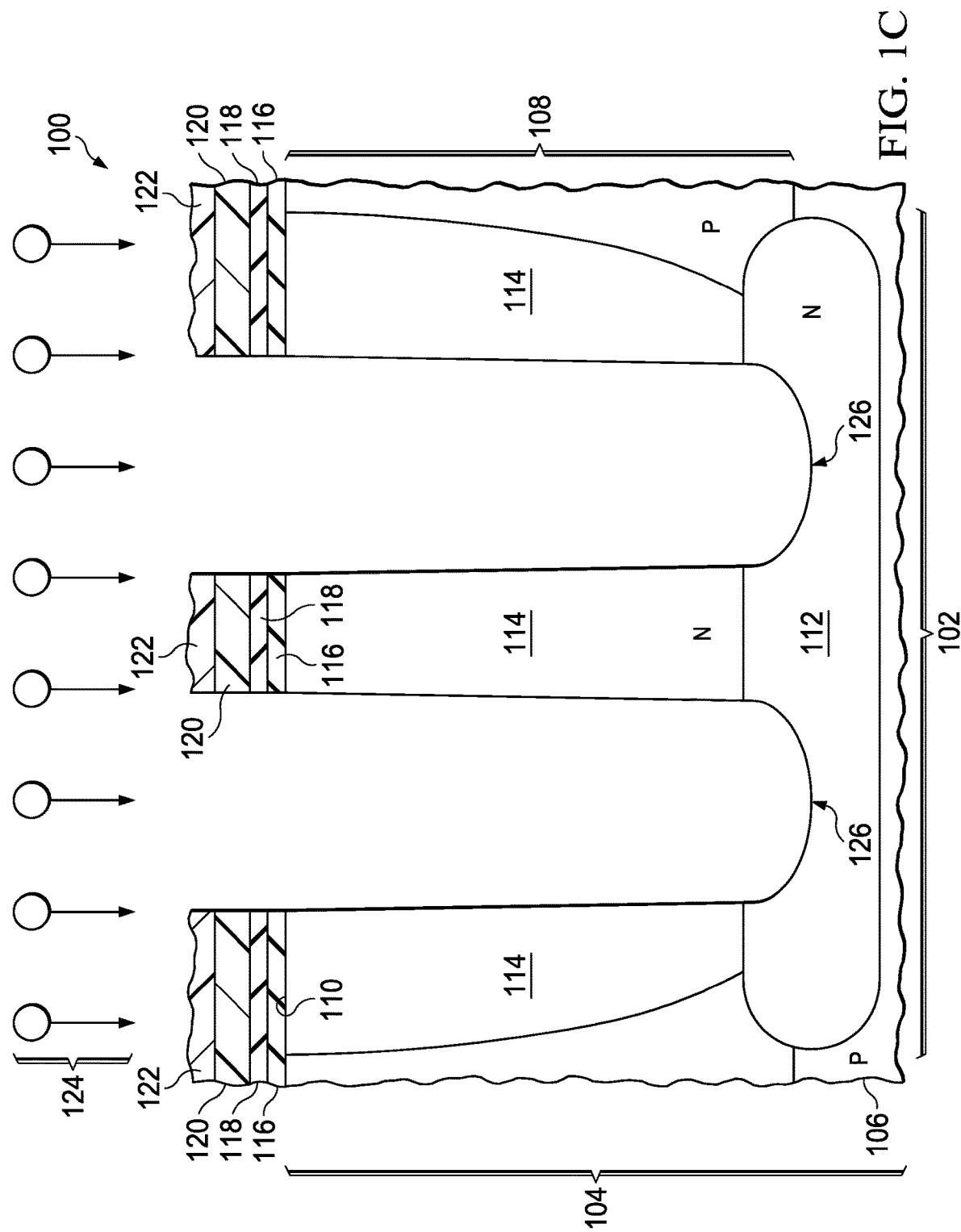

Referring to FIG. 1C, a trench etch process 124 is performed to form the trenches 126 in the semiconductor material 108. The trench etch process 124 may include multiple steps. In one implementation for example, a hard mask etch may be first performed to remove the hard mask layer 120 where exposed by the trench mask 122, and a silicon etch may then be performed to remove the nitride cap layer 118, the pad oxide layer 116, and the semiconductor material 108 in the semiconductor material 108 in regions that are exposed by the hard mask layer 120, to form the trenches 126. The trenches 126 extend from the top surface 110 of the substrate 104 into the semiconductor material 108. The trenches 126 may extend to the buried layer 112, as depicted in FIG. 1C, so that the buried layer 112 extends under the trenches 126. In an alternate version of this example, the trenches 126 may extend proximate to, but not contact, the buried layer 112. During the silicon etch, the trench mask 122 may also be partially or completely removed, leaving the hard mask layer 120 to prevent the area outside of the trenches 126 from being etched. FIG. 1C depicts trench etch process 124 at completion, and the trench mask 122 partially removed by the trench etch process 124. Any portion of the trench mask 122 that remains after the trench etch process 124 is completed is subsequently removed. Organic polymers in the trench mask 122 may be removed using an oxygen plasma, followed by a series of wet etch processes, including an aqueous mixture of sulfuring acid and hydrogen peroxide, an aqueous mixture of ammonium hydroxide and hydrogen peroxide, and an aqueous mixture of hydrochloric acid and hydrogen peroxide.

Referring to FIG. 1D, a capacitor dielectric 128 is formed in the trenches 126, contacting the semiconductor material 108 of the substrate 104. The capacitor dielectric 128 may extend over the hard mask layer 120, the nitride cap layer 118, and the pad oxide layer 116. The capacitor dielectric 128 includes a silicon-nitrogen compound, and may include silicon dioxide or other dielectric material. In this example, the capacitor dielectric 128 may include an outer layer 130 contacting the semiconductor material 108 of the substrate 104, a center layer 132 on the outer layer 130, and an inner layer 134 on the center layer 132.

The outer layer 130 may include silicon dioxide, and may be formed by a thermal oxidation process which oxidizes silicon in the substrate 104 at the trenches 126. The outer layer 130 may not extend onto the hard mask layer 120, the nitride cap layer 118, and the pad oxide layer 116, as depicted in FIG. 1D, due to a lack of available silicon to be oxidized in these layers. The outer layer 130 may be at least 3 nanometers thick, to provide low leakage current in the trench capacitor 102 during operation of the semiconductor device 100, and may be 6 nanometers to 10 nanometers thick, depending on an operating potential of the trench capacitor 102.

The center layer 132 includes the silicon-nitrogen compound, which may be implemented as silicon nitride or silicon oxynitride. The center layer 132 may be formed by a CVD process or an LPCVD process using a silicon-containing reagent gas, labeled "SILICON REAGENT" in FIG. 1D and a nitrogen-containing reagent gas, labeled "NITROGEN REAGENT" in FIG. 1D. The silicon-containing reagent gas may be implemented as silane or dichlorosilane. The nitrogen-containing reagent gas may be implemented as ammonia or hydrazine. Alternatively, the silicon-containing reagent gas and the nitrogen-containing reagent gas may be implemented as bis(tertiary-butyl-amino)silane (BTBAS). A thickness of the center layer 132 may be selected to provide a desired capacitance density and breakdown potential for the trench capacitor 102. By way of example, the center layer 132 may be 12 nanometers thick to provide a breakdown potential greater than 12 volts. In other version of this example, the center layer 132 may be 8 nanometers to 40 nanometers thick. Having the silicon-nitrogen compound in the capacitor dielectric 128 may advantageously provide more reliability and higher operating potential compared to a dielectric layer without the silicon-nitrogen compound.

The inner layer 134 may include primarily silicon dioxide or silicon oxynitride, to reduce charge trapping in the capacitor dielectric 128 and to provide a suitable interface to a subsequently formed trench-fill material 136, shown in FIG. 1E. The inner layer 134 may be formed by a CVD process or an LPCVD process using the silicon-containing reagent gas, labeled "SILICON REAGENT" in FIG. 1D and an oxygen-containing reagent gas, labeled "OXYGEN REAGENT" in FIG. 1D, and optionally using the nitrogen-containing reagent gas, if nitrogen is needed to form the inner layer 134. The oxygen-containing reagent gas may be implemented as oxygen or nitrous oxide. Alternatively, the silicon-containing reagent gas and the oxygen-containing reagent gas may be implemented as tetraethoxysilane (TEOS), also referred to as tetraethyl orthosilicate. The inner layer 134 may have a thickness of 40 nanometers to 60 nanometers immediately after being formed. A trench dielectric etch process may be performed after the inner layer 134 is formed to improve thickness uniformity of the inner layer 134 along sidewalls of the trenches 126.

Figure 1E:
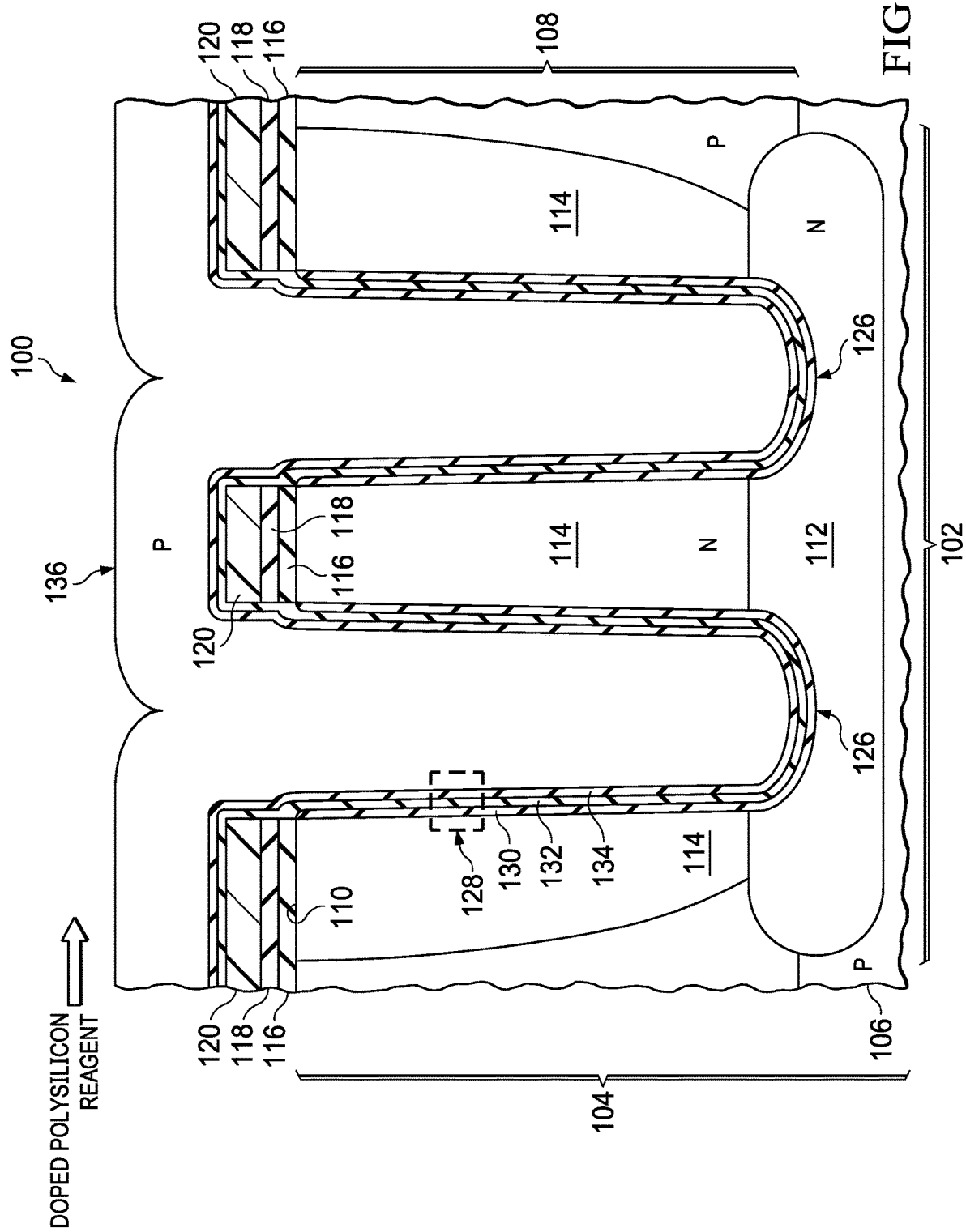

Referring to FIG. 1E, the trench-fill material 136 is formed in the trenches 126 on the capacitor dielectric 128. The trench-fill material 136 includes primarily silicon, and may be implemented as polycrystalline silicon, commonly referred to as polysilicon. Alternatively, the trench-fill material 136 may be implemented as amorphous silicon, or semi-amorphous silicon. The trench-fill material 136 may have the first conductivity type, p-type in this example, as indicated in FIG. 1E. For example, the trench-fill material 136 may have an average concentration of dopants of $5 \times 10^{18}$ cm$^{-3}$ and $1 \times 10^{20}$ cm$^{-3}$, to provide a low equivalent series resistance for the trench capacitor 102.

The trench-fill material 136 may be formed by thermal decomposition of a silicon-containing reagent gas that includes dopants, labeled "DOPED POLYSILICON REAGENT" in FIG. 1E. The trench-fill material 136 fills the trenches 126 and may extend over the substrate 104 outside of the trenches 126, as depicted in FIG. 1E.

Figure 1F:
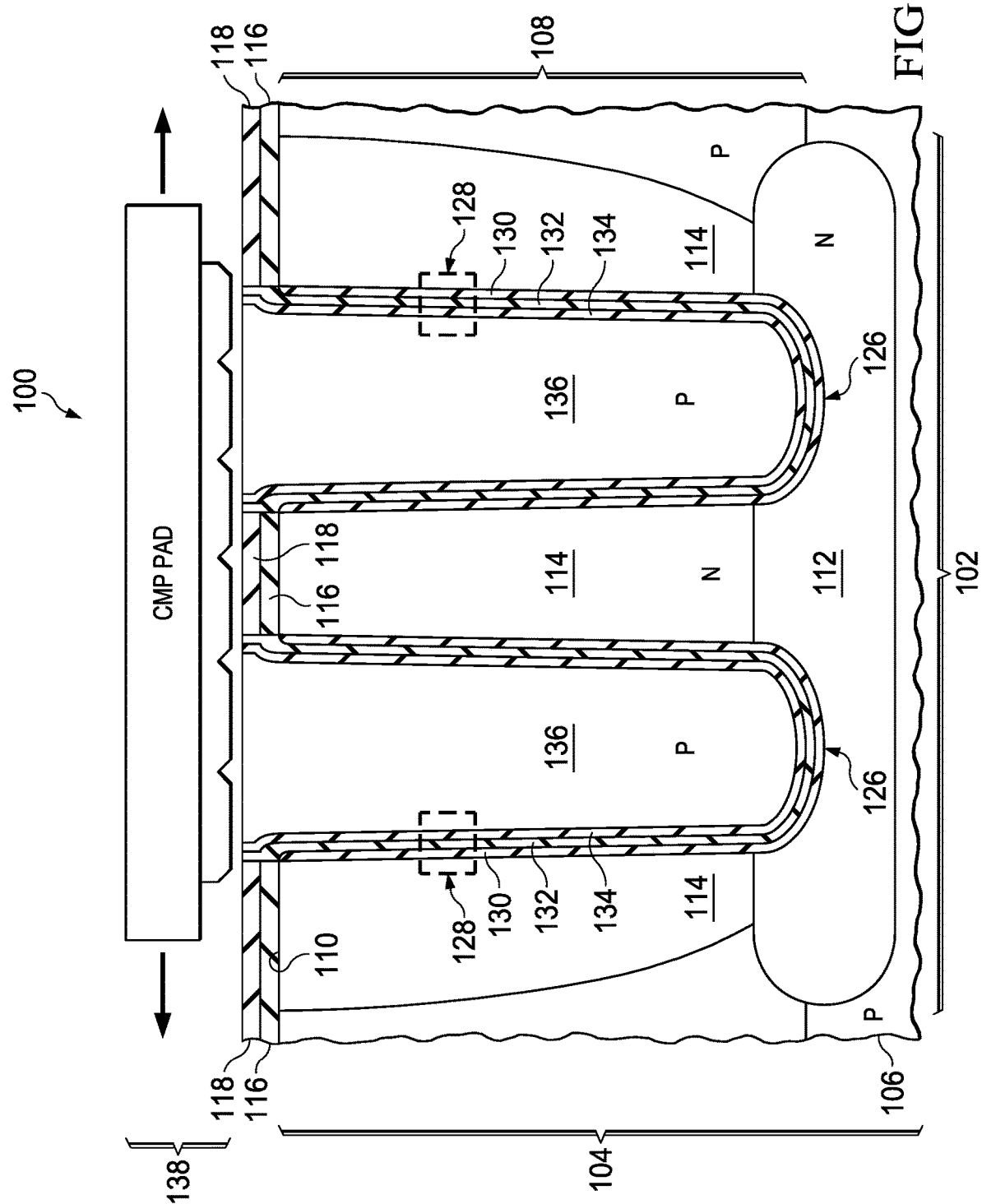

Referring to FIG. 1F, the trench-fill material 136 and the capacitor dielectric 128 are removed from outside of the trenches 126. The trench-fill material 136 and the capacitor dielectric 128 may be removed by a planarization process, such as a chemical mechanical polish (CMP) process 138, as indicated in FIG. 1F. Alternatively, the trench-fill material 136 and the capacitor dielectric 128 may be removed by an etchback process. The process of removing the trench-fill material 136 and the capacitor dielectric 128 leaves the trench-fill material 136 on the capacitor dielectric 128 in the trenches 126. The process of removing the trench-fill material 136 and the capacitor dielectric 128 may leave the nitride cap layer 118 and the pad oxide layer 116 on the top surface 110 of the substrate 104. The nitride cap layer 118 may provide a stop layer for the CMP process or the etchback process. The nitride cap layer 118 and the pad oxide layer 116 may be removed in a separate process, after removing the trench-fill material 136 and the capacitor dielectric 128 from outside of the trenches 126.

Figure 1G:
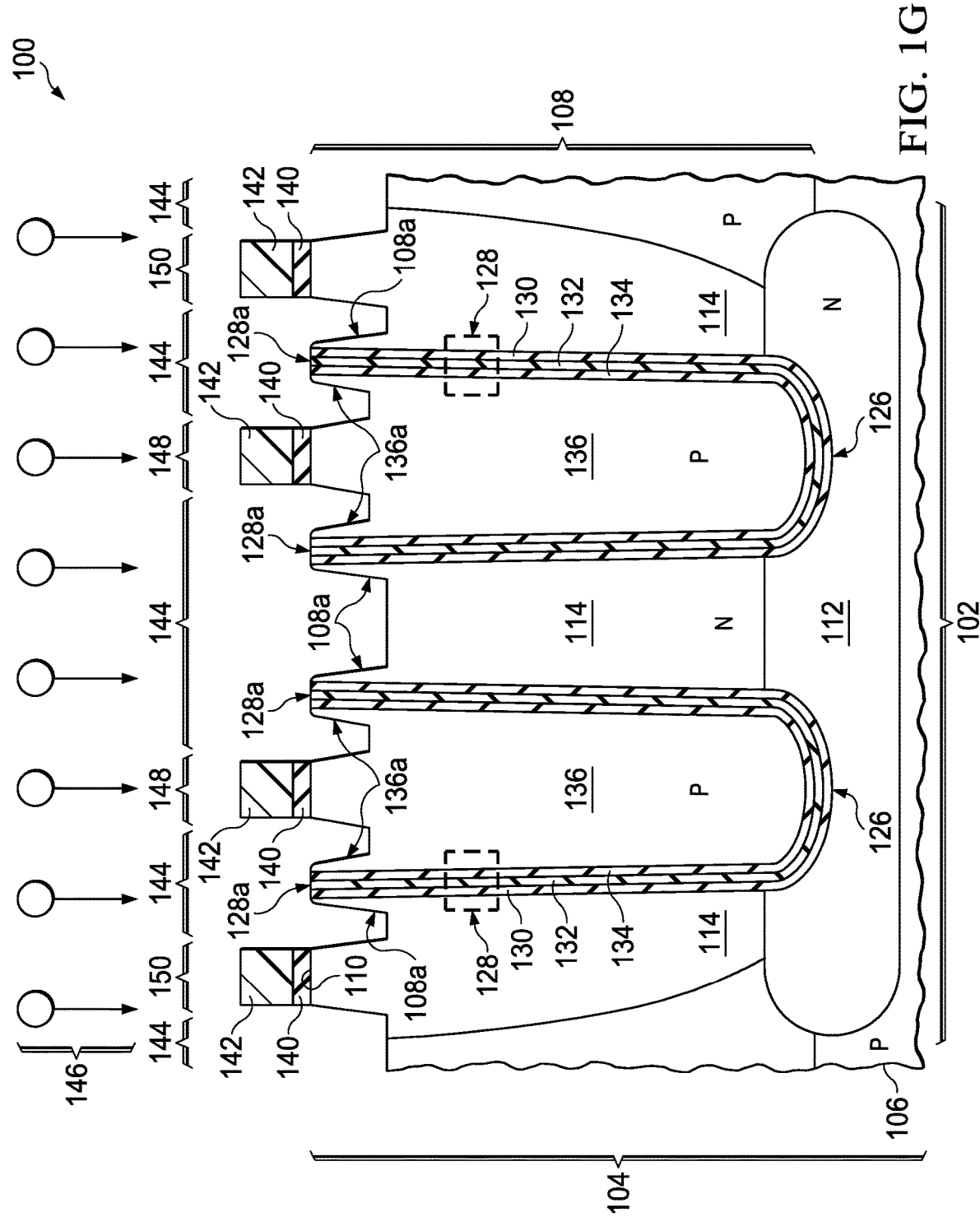

Referring to FIG. 1G, a CMP stop layer 140 is formed over the top surface 110 of the substrate 104, the capacitor dielectric 128, and the trench-fill material 136. The CMP stop layer 140 may include a silicon dioxide layer on the substrate 104, the capacitor dielectric 128, and the trench-fill material 136, and a silicon nitride layer on the pad layer. The silicon dioxide layer may be 5 nanometers to 20 nanometers thick, and may be formed by a thermal oxidation process. The silicon nitride layer may be 100 nanometers to 200 nanometers thick, and may be formed by an LPCVD process. Layers of other materials having a high CMP selectivity to silicon dioxide may be substituted for the silicon nitride layer.

A field oxide mask 142 is formed over the CMP stop layer 140, exposing the CMP stop layer 140 in areas for a field oxide trench, commonly referred to as a shallow trench or a shallow trench isolation (STI) trench. The field oxide mask 142 may include photoresist and may be formed by a photolithographic process. The CMP stop layer 140 is removed where exposed by the field oxide mask 142. Subsequently, semiconductor material 108 from the substrate 104 around tops of the trenches 126 and the trench-fill material 136 at the tops of the trenches 126 are removed by a trench etch process 146 to form a shallow trench 144 in the substrate 104 and the trench-fill material 136. The shallow trench 144 may extend to a depth of 250 nanometers to 1 micron in the semiconductor material 108, and to a depth of 200 nanometers to 800 nanometers in the trench-fill material 136, by way of example. The depth of the shallow trench 144 in the semiconductor material 108 is much less than a depth of the trenches 116 in the semiconductor material 108, so that the trenches 116 extend several microns below the shallow trench 144. The semiconductor material 108 contacts the capacitor dielectric 128 below the shallow trench 144.

The trench etch process 146 may be implemented as a two-step process, in which a first etch step removes the CMP stop layer 140, and a second etch step removes the semiconductor material 108 and the trench-fill material 136. The first etch step may be implemented as a reactive ion etch (RIE) process using fluorine and oxygen, for example. The second etch step may be implemented as an RIE process using one or more halogens, for example. The trench etch process 146 removes the capacitor dielectric 128 at a lower rate than the semiconductor material 108, and at a lower rate than the trench-fill material 136, so that a portion 128a of the capacitor dielectric 128 extends into the shallow trench 144. A portion 108a of the semiconductor material 108 contacting the portion 128a of the capacitor dielectric 128 may extend into the shallow trench 144, as a secondary result of the low etch rate of the capacitor dielectric 128. A portion 136a of the trench-fill material 136 contacting the portion 128a of the capacitor dielectric 128 may extend into the shallow trench 144, as another secondary result of the low etch rate of the capacitor dielectric 128. The shallow trench 144 does not extend into a trench contact opening 148 in each trench 126. The shallow trench 144 also does not extend into substrate contact openings 150 on at least two opposite sides of the plurality of the trenches 126. The trench capacitor 102 is free of the substrate contact openings 150 between the trenches 126.

A portion of the field oxide mask 142 may be removed by the trench etch process 146. After the shallow trench 144 is formed, any remaining portion of the field oxide mask 142 may be completely removed. Photoresist and other organic material in the field oxide mask 142 may be removed by an oxygen plasma process, followed by a series of wet etch processes, including an aqueous mixture of sulfuring acid and hydrogen peroxide, an aqueous mixture of ammonium hydroxide and hydrogen peroxide, and an aqueous mixture of hydrochloric acid and hydrogen peroxide.

Figure 1H:
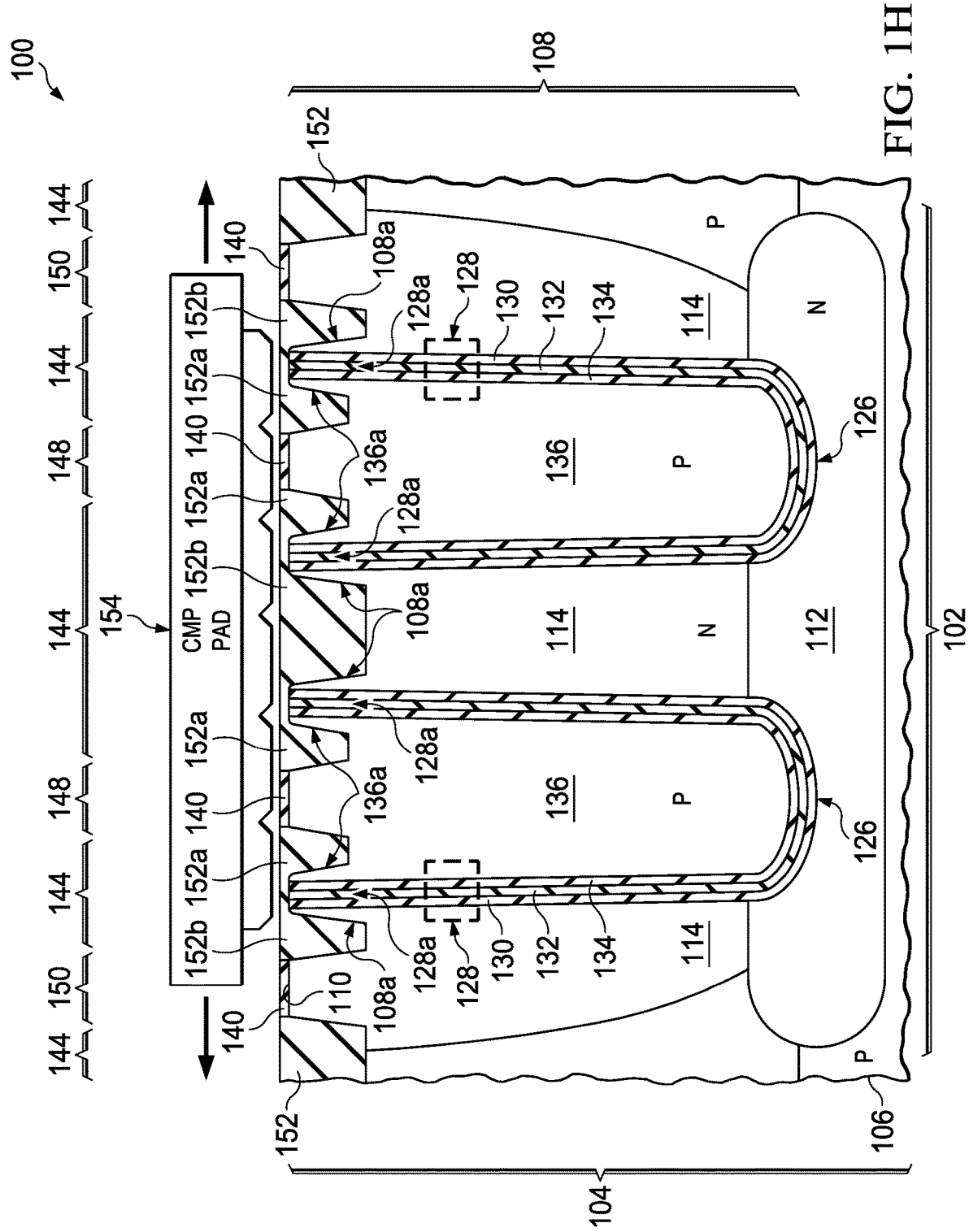

Referring to FIG. 1H, a field oxide layer 152 is formed in the shallow trench 144. The field oxide layer 152 is planarized so that the field oxide layer 152 does not extend over the top surface 110 of the substrate 104 in the trench capacitor 102. The field oxide layer 152 may be planarized by a CMP process, as indicated by the CMP pad 154 in FIG. 1H. The CMP stop layer 140 may advantageously protect the top surface 110 in the trench contact openings 148 and the substrate contact openings 150 during the CMP process. The field oxide layer 152 may include primarily silicon dioxide, or silicon dioxide-based dielectric material, formed by one or more CVD processes alternated with etchback processes to provide complete filling of the shallow trench 144.

The portion 128a of the capacitor dielectric 128 extends into the field oxide layer 152, between a first segment 152a of the field oxide layer 152 and a second segment 152b of the field oxide layer 152. The first segment 152a is located over the trench-fill material 136 in each trench 126. The second segment 152b is located over the semiconductor material 108 adjacent to the trenches 126.

After the field oxide layer 152 is planarized, silicon nitride in the CMP stop layer 140 is removed. The silicon nitride may be removed by a wet etch process using an aqueous solution of phosphoric acid at 140° C. to 170° C. Silicon dioxide in the CMP stop layer 140 may optionally be removed, by a wet etch process using an aqueous solution of buffered hydrofluoric acid.

Figure 1I:
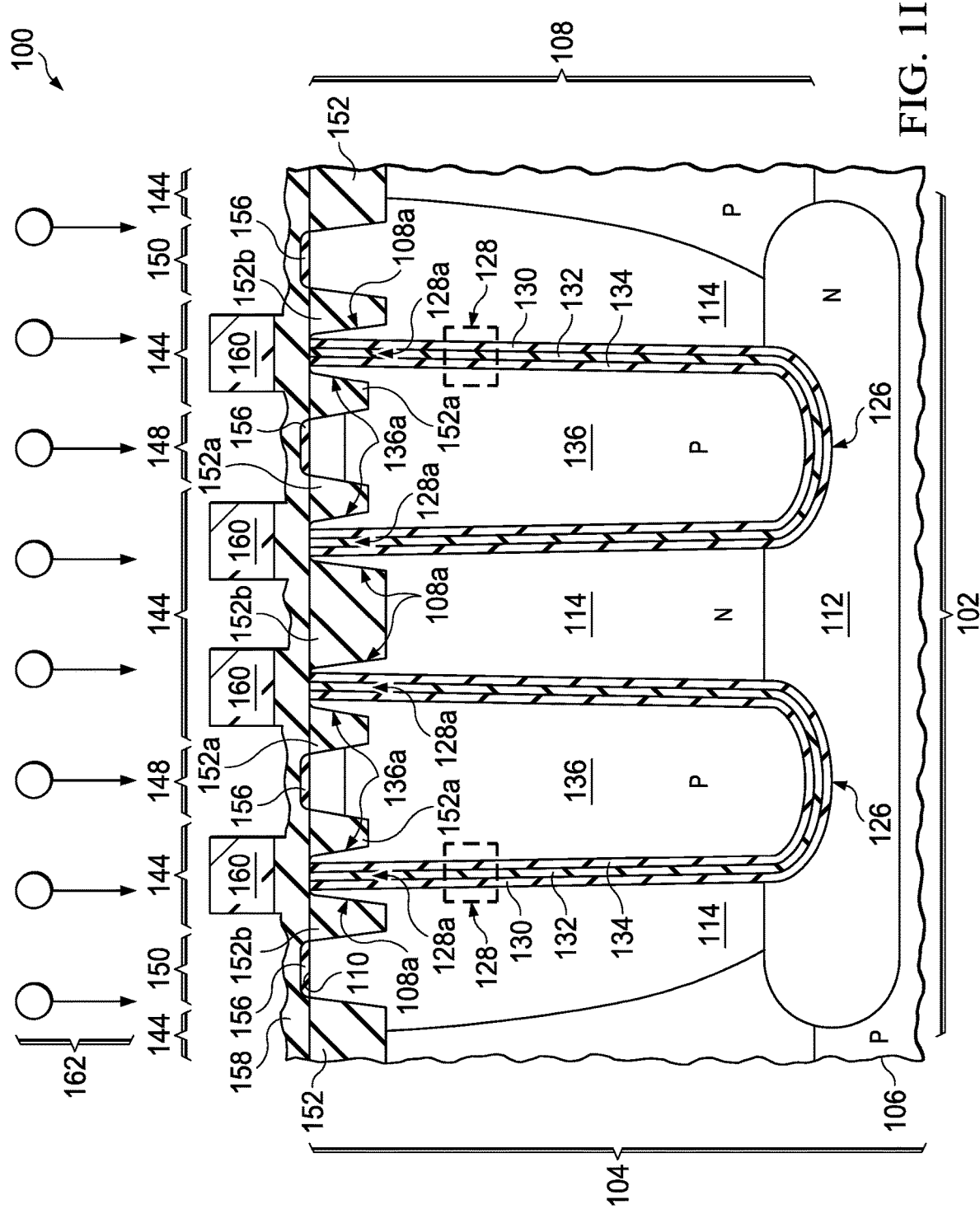

Referring to FIG. 1I, a protective oxide layer 156 may be formed on the top surface 110 of the substrate 104 in the trench contact openings 148 and the substrate contact openings 150. The protective oxide layer 156 may be formed by thermal oxidation of silicon in the semiconductor material 108 at the top surface 110. The protective oxide layer 156 may be 5 nanometers to 20 nanometers thick, for example. The top surface 110 may be deglazed using an aqueous solution of buffered hydrofluoric acid prior to forming the protective oxide layer 156. One or more of the portions 128a of the capacitor dielectric 128, along with one or more of the portions 108a of the semiconductor material 108, or one or more of the portions 136a of the trench-fill material 136, or both, may be exposed by the field oxide layer 152.

A silicide-blocking layer 158 is formed over the top surface 110 of the substrate 104. The silicide-blocking layer 158 may include one or more layers of silicon dioxide, silicon nitride, silicon oxynitride, or other dielectric material which is essentially unreactive with metals, such as titanium, cobalt, nickel, or platinum, that are used to form metal silicide. The silicide-blocking layer 158 may be formed by one or more LPCVD or PECVD processes. Silicon dioxide in the silicide-blocking layer 158 may be formed using TEOS. Silicon nitride in the silicide-blocking layer 158 may be formed using BTBAS. Silicon oxynitride in the silicide-blocking layer 158 may be formed using a combination of TEOS and BTBAS. One or more of the portions 128a of the capacitor dielectric 128, along with one or more of the portions 108a of the semiconductor material 108, or one or more of the portions 136a of the trench-fill material 136, or both, may contact the silicide-blocking layer 158, or may be separated from the silicide-blocking layer 158 by less than 10 nanometers of silicon dioxide.

A silicide-blocking mask 160 is formed over the silicide-blocking layer 158 that covers the silicide-blocking layer 158 over the portions 128a of the capacitor dielectric 128, and exposes the silicide-blocking layer 158 in the trench contact openings 148 and the substrate contact openings 150. The silicide-blocking mask 160 may include photoresist, and may be formed by a photolithographic process.

The silicide-blocking layer 158 is removed where exposed by the silicide-blocking mask 160, leaving the silicide-blocking layer 158 over the portions 128a of the capacitor dielectric 128. The silicide-blocking layer 158 may be removed by an RIE process 162 using fluorine, and optionally oxygen. FIG. 1I depicts the silicide-blocking layer 158 partway to removal where exposed by the silicide-blocking mask 160. After the silicide-blocking layer 158 is removed where exposed by the silicide-blocking mask 160, the silicide-blocking mask 160 is removed. Photoresist and other organic material in the silicide-blocking mask 160, may be removed by a similar process used to remove the field oxide mask 142 of FIG. 1G.

Figure 1J:
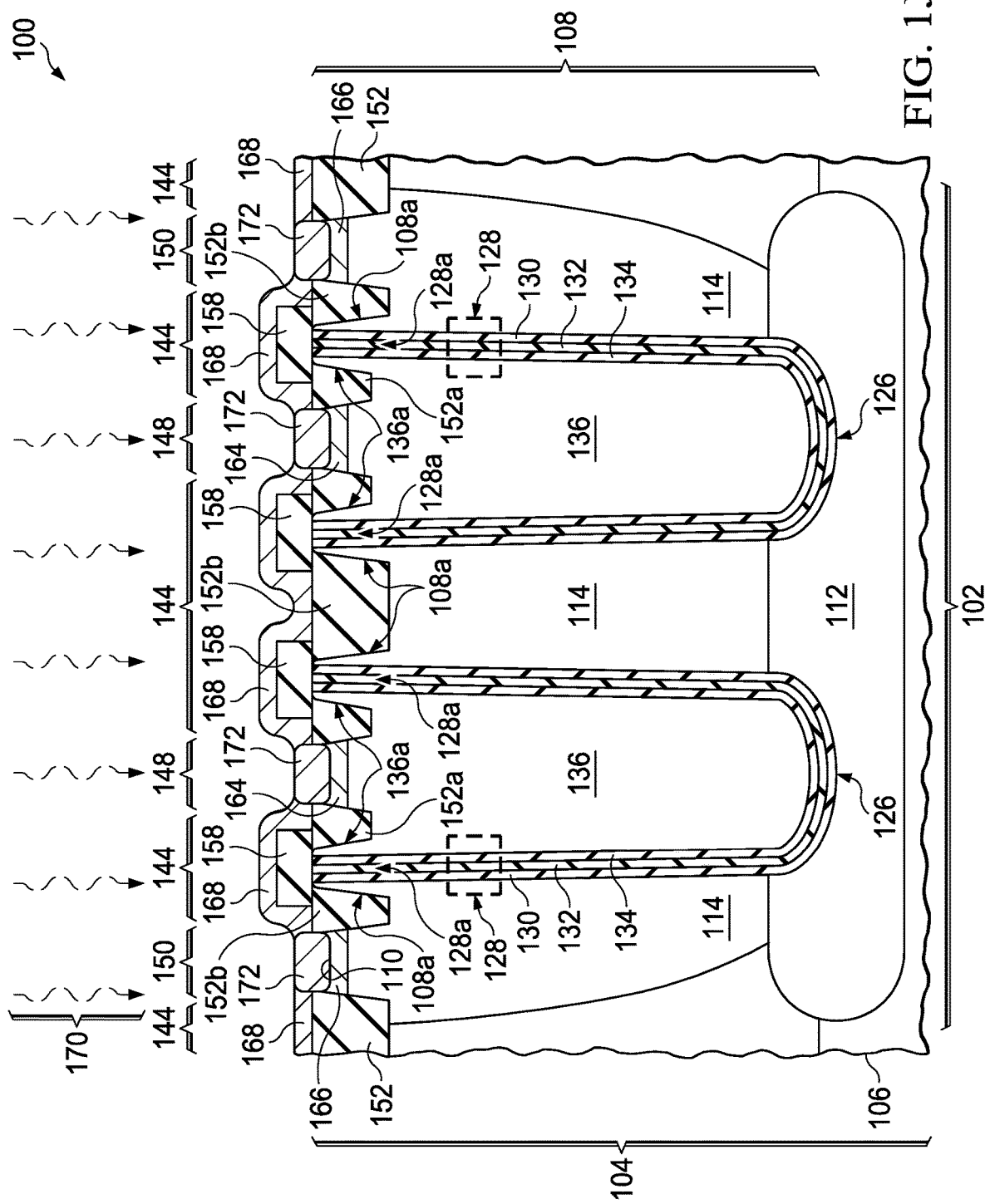

Referring to FIG. 1J, trench contacts 164 may be formed in the trench-fill material 136 in the trench contact openings 148. The trench contacts 164 may be formed by implanting first conductivity type dopants, such as boron or gallium in this example, into the trench-fill material 136 in the trench contact openings 148, followed by annealing the substrate 104 to activate the implanted first conductivity type dopants. The trench contacts 164 thus have the first conductivity type, and may have average dopant concentrations above $10^{19}$ cm$^{-3}$, to provide low resistance connections to the trench-fill material 136.

Substrate contacts 166 may be formed in the semiconductor material 108 in the substrate contact openings 150. The substrate contacts 166 may be formed by implanting second conductivity type dopants, such as phosphorus, arsenic, or antimony in this example, into the semiconductor material 108 in the substrate contact openings 150, followed by annealing the substrate 104 to activate the implanted second conductivity type dopants. The substrate contacts 166 thus have the second conductivity type, and may have average dopant concentrations above $10^{19}$ cm$^{-3}$, to provide low resistance connections to the semiconductor material 108 around the trenches 126.

The protective oxide layer 156 of FIG. 1I is removed to expose the trench-fill material 136 in the trench contacts 164, and to expose the semiconductor material 108 in the substrate contacts 166. The protective oxide layer 156 may be removed by a wet etch process using an aqueous solution of dilute buffered hydrofluoric acid, followed by appropriate cleans and rinses.

A metal layer 168 is formed over the substrate 104, contacting the trench-fill material 136 in the trench contacts 164, and contacting the semiconductor material 108 in the substrate contacts 166. The metal layer 168 may include titanium, cobalt, nickel, or platinum, or a combination thereof, by way of example. The metal layer 168 may be 10 nanometers to 100 nanometers thick, by way of example. The metal layer 168 is separated from the portions 128*a* of the capacitor dielectric 128, and from the portions 108*a* of the semiconductor material 108 and the portions 136*a* of the trench-fill material 136, if present, by the silicide-blocking layer 158.

The metal layer 168 is heated by a radiant heating process 170, causing the metal layer 168 to react with silicon in the trench contacts 164 the substrate contacts 166 and form a metal silicide layer 172 on the trench-fill material 136 of the trench contacts 164, and on the semiconductor material 108 of the substrate contacts 166. The silicide-blocking layer 158 does not react with the metal layer 168 to any significant degree, so that no significant amount of metal silicide is formed on the silicide-blocking layer 158, that is, no metal silicide remains on the silicide-blocking layer 158 after unreacted metal of the metal layer 168 is removed. The silicide-blocking layer 158 prevents metal silicide from being formed on the portions 128*a* of the capacitor dielectric 128, the portions 108*a* of the semiconductor material 108, and the portions 136*a* of the trench-fill material 136. Without the silicide-blocking layer 158, metal silicide may be formed on the portions 128*a* of the capacitor dielectric 128, the portions 108*a* of the semiconductor material 108, and the portions 136*a* of the trench-fill material 136, leading to unwanted electrical connections between the trench-fill material 136 and the semiconductor material 108. Thus, having the silicide-blocking layer 158 over the portions 128*a* of the capacitor dielectric 128 may advantageously prevent the unwanted electrical connections between the trench-fill material 136 and the semiconductor material 108.

After the metal silicide layer 172 is formed, the unreacted metal of the metal layer 168 is removed, leaving at least a portion of the metal silicide layer 172 in place. The unreacted metal of the metal layer 168 may be removed by a wet etch process using an aqueous mixture of nitric acid, hydrochloric acid, sulfuric acid or hydrofluoric acid, or a combination of these acids. After the unreacted metal of the metal layer 168 is removed, the silicide-blocking layer 158 is free of the metal silicide layer 172.

Figure 1K:
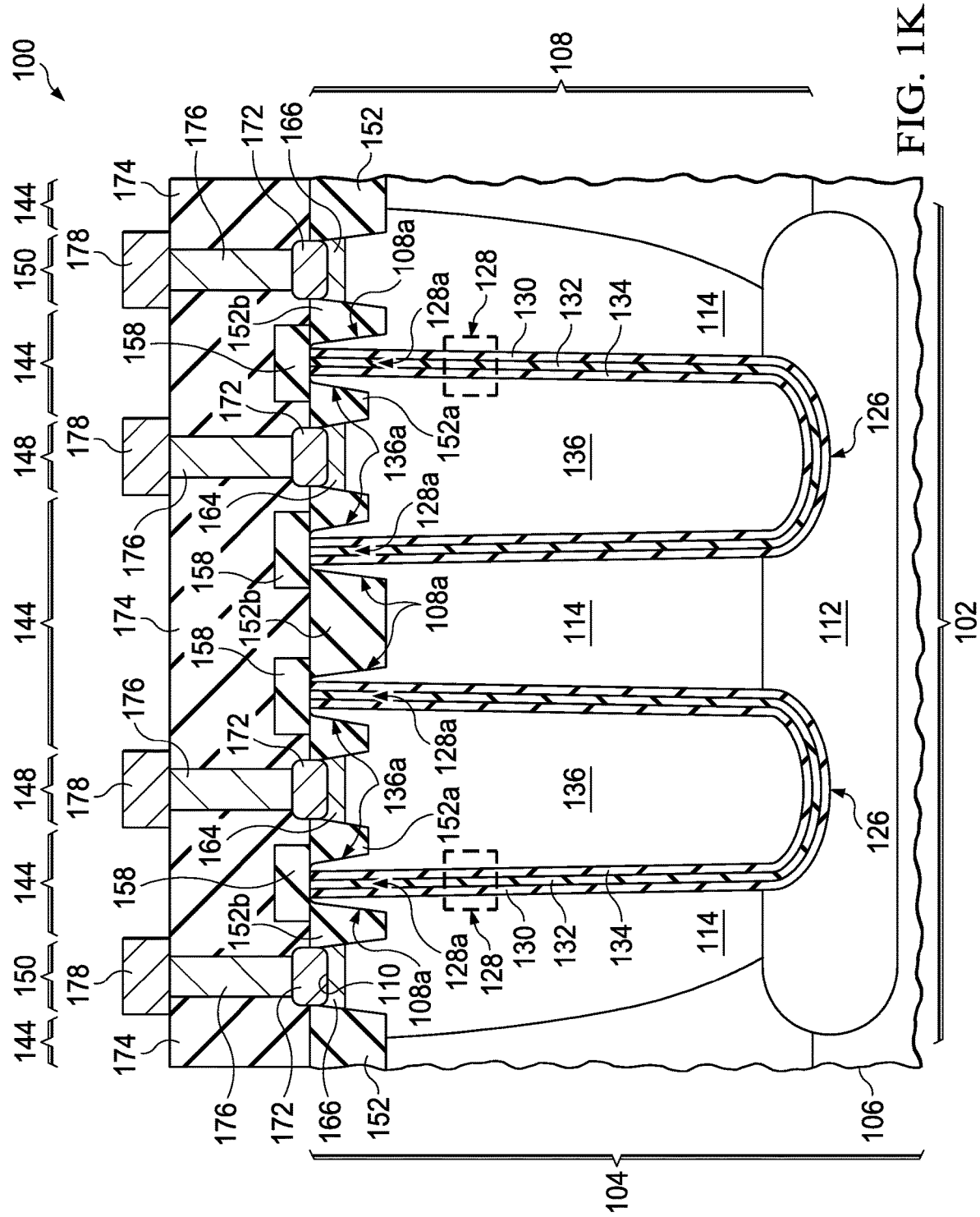

Referring to FIG. 1K, a pre-metal dielectric (PMD) layer 174 may be formed over the substrate 104, the silicide-blocking layer 158, and the metal silicide layer 172. The PMD layer 174 may include one or more sublayers of dielectric material, such as a PMD liner of silicon nitride on the substrate 104, the silicide-blocking layer 158, and the metal silicide layer 172, a main sublayer of silicon dioxide-based dielectric material on the PMD liner, and a PMD cap layer of silicon nitride or silicon carbide on the main sublayer. Other sublayer structures for the PMD layer 174 are within the scope of this example. The PMD layer 174 may be 300 nanometers to 2 microns thick, by way of example, and may be formed by one or more PECVD or CVD processes.

Contacts 176 may be formed through the PMD layer 174 to make electrical connections to the metal silicide layer 172. The contacts 176 may be formed by etching contact holes through the PMD layer 174 to expose the metal silicide layer 172, forming a contact liner containing titanium or tantalum in the contact holes, and forming a contact fill metal containing tungsten on the contact liner, followed by removing the contact fill metal and the contact liner from the PMD layer 174 outside of the contact holes.

Interconnects 178 may be formed on the PMD layer 174 to make electrical connections to the contacts 176. The interconnects may include aluminum alloy, and may be formed by forming sublayers of metal, including a main sublayer of aluminum with a few weight percent of silicon, copper or titanium, on the PMD payer 174, followed by masking and etching the sublayers of metal, to form etch aluminum interconnects 178 as shown in FIG. 1K. Alternatively, the interconnects may be formed by a damascene process: an intra-metal dielectric (IMD) layer is formed on the PMD layer 174, and interconnect trenches are formed through the IMD layer, exposing the contacts 176. A trench liner metal containing tantalum or tantalum nitride is formed in the interconnect trenches, and a copper fill metal is formed on the trench liner metal by a combination of sputter and electroplating processes. The copper fill metal and the trench liner metal are removed from over the IMD layer by a CMP process. Other structures and methods of forming the interconnects 178 are within the scope of this example.

The trench-fill material 136 in the trenches 126 provides a first plate of the trench capacitor 102. The semiconductor material 108 around the trenches 126 provides a second plate of the trench capacitor 102. The capacitor dielectric 128 provides a capacitor dielectric of the trench capacitor 102. Having the trench capacitor 102 free of the substrate contacts 166 between the trenches 126 may advantageously provide a higher capacitance per area compared to trench capacitors with substrate contacts between trenches. The interconnects 178 that are electrically coupled to the substrate contacts 166 may be parts of a substrate bus that surrounds, or partially surrounds, the trenches. Having the metal silicide layer 172 on the trench contacts 164 and the substrate contacts 166 may provide a lower equivalent series resistance for the trench capacitor 102 compared to a trench capacitor without metal silicide. Having the silicide-blocking layer 158 over the portions 128*a* of the capacitor dielectric 128, the portions 108*a* of the semiconductor material 108, and the portions 136*a* of the trench-fill material 136 extending into the field oxide layer 152 may enable having both the metal silicide-layer 172 and the silicon-nitrogen compound in the capacitor dielectric 128 in the trench capacitor 102, advantageously providing both a lower equivalent series resistance and a higher reliability compared to a trench capacitor without metal silicide and a silicon-nitrogen compound in its capacitor dielectric.

FIG. 2 discloses a top down view of a semiconductor device 200 containing a trench capacitor 202. The semiconductor device 200 is formed in and on a substrate 204 having a semiconductor material 208 extending to a top surface 210 of the substrate 204. A buried layer, not shown in FIG. 2, but similar to the buried layer 112 of FIG. 1A, may be located in the substrate 104. A deep well, not shown in FIG. 2, but similar to the deep well 114 of FIG. 1A, may be located in the semiconductor material 208. The center area of the trench capacitor 202 contains a plurality of trenches 226 in the semiconductor material 208. Each trench 226 has a capacitor dielectric 228 containing the semiconductor material 208, and a trench-fill material 236 contacting the capacitor dielectric 228, for example, as disclosed in reference to FIG. 1A through FIG. 1K. The trench-fill material 236 is electrically conductive and provide a first plate of the trench capacitor 202. The semiconductor material 208 provides a second plate of the trench capacitor 202.

The trenches 226 have widths 280 and lengths 282 which are dimensions of the trenches 226 in directions parallel to the top surface 210 of the substrate 204. The lengths 282 are less than twice the widths 280, and may be approximately equal to the widths 280, within fabrication tolerances encountered in fabrication of the semiconductor device 200, which may advantageously provide a higher capacitance density for the trench capacitor 202, compared to a similar trench capacitor with trenches having lengths significantly greater than widths. The trenches 226 are separated by spacings 284 which are less than twice the widths 280. The spacings 284 may be minimum distances allowed by a fabrication process used to form the semiconductor device 200, which may advantageously provide a higher capacitance density for the trench capacitor 202, compared to a similar trench capacitor with trenches spaced farther apart.

The semiconductor device 200 includes a field oxide layer 252 over the semiconductor material 208. A portion of the capacitor dielectric 228 extends into the field oxide layer 252, as disclosed in reference to FIG. 1A through FIG. 1K. The field oxide layer 252 has trench contact openings 248 over the trench-fill material 236 and substrate contact openings 250 over the semiconductor material 208 around the plurality of trenches 226. The trench capacitor 202 is free of the substrate contact openings 250 between the trenches 226. Having the trenches 226 placed at or near a minimum distance may not allow any of the substrate contact openings 250 to be placed between the trenches 226.

A silicide-blocking layer 258 is located over the field oxide layer 252, overlapping the portion of capacitor dielectric 228 extending into the field oxide layer 252. The silicide-blocking layer 258 does not extend into the trench contact openings 248 or into the substrate contact openings 250. A metal silicide layer 272 is located on the semiconductor material 208 in the trench contact openings 248 and the substrate contact openings 250. The silicide-blocking layer 258 is free of the metal silicide layer 272.

The semiconductor device 200 includes interconnects 278 above the field oxide layer 252. The trench-fill material 236 is electrically coupled to one or more of the interconnects 278 through the metal silicide layer 272, and through contacts, not shown in FIG. 2, similar to the contacts 176 of FIG. 1K. The semiconductor material 208 around the plurality of trenches 226 is electrically coupled to other interconnects 278 through the metal silicide layer 272, and through the contacts. The substrate contact openings 250 are located on at least two opposite sides of the plurality of trenches 226 to provide a low equivalent series resistance for the trench capacitor 202. The substrate contact openings 250 may be located on three or four sides of the plurality of trenches 226, to provide a lower equivalent series resistance.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a substrate having a semiconductor material;
   a field oxide layer on the substrate; and
   a trench capacitor in the substrate, the trench capacitor including:
   trenches in the semiconductor material;
   a capacitor dielectric on the semiconductor material in each of the trenches;
   a trench-fill material on the capacitor dielectric in each of the trenches, the trench-fill material being electrically conductive, the trench-fill material providing a first plate of the trench capacitor and the semiconductor material providing a second plate of the trench capacitor;
   trench contacts through the field oxide layer to the trench-fill material in each of the trenches; and
   substrate contacts to the semiconductor material in a region around the trenches, wherein the trench capacitor is free of contacts to the semiconductor material between the trenches;
   wherein a portion of the capacitor dielectric extends into the field oxide layer, between a first segment of the field oxide layer and a second segment of the field oxide layer, the first segment being located over the trench-fill material in each trench, and the second segment being located over the semiconductor material.

2. The semiconductor device of claim 1, wherein the capacitor dielectric includes a silicon-nitrogen compound.

3. The semiconductor device of claim 2, wherein the capacitor dielectric includes an outer layer of silicon dioxide contacting the semiconductor material of the substrate, a center layer including the silicon-nitrogen compound, the silicon-nitrogen compound selected from a group consisting of silicon nitride and silicon oxynitride, and an inner layer of silicon dioxide contacting the trench-fill material.

4. The semiconductor device of claim 1, the trench capacitor further including a metal silicide layer on the semiconductor material in the substrate contacts.

5. The semiconductor device of claim 4, the trench capacitor further including a silicide blocking layer over the field oxide layer, extending over the portion of the capacitor dielectric extending into the field oxide layer, the silicide blocking layer being free of the metal silicide layer.

6. The semiconductor device of claim 5, wherein the portion of the capacitor dielectric extending into the field oxide layer contacts the silicide blocking layer.

7. The semiconductor device of claim 5, wherein a portion of the semiconductor material of the substrate extends into the field oxide layer along the portion of the capacitor dielectric extending into the field oxide layer.

8. The semiconductor device of claim 7, wherein the portion of the semiconductor material of the substrate extending into the field oxide layer along the portion of the capacitor dielectric contacts the silicide blocking layer.

9. The semiconductor device of claim 5, wherein the trench-fill material includes polycrystalline silicon, and a portion of the polycrystalline silicon extends into the field oxide layer along the portion of the capacitor dielectric extending into the field oxide layer.

10. The semiconductor device of claim 9, wherein the portion of the polycrystalline silicon extending into the field oxide layer along the portion of the capacitor dielectric contacts the silicide blocking layer.

11. A method of forming a semiconductor device, comprising:
   forming a trench capacitor in a substrate, by a process including:
   forming trenches in a semiconductor material of the substrate;
   forming a capacitor dielectric on the semiconductor material in each of the trenches;
   forming a trench-fill material on the capacitor dielectric in each of the trenches, the trench-fill material being electrically conductive;
   forming a field oxide layer on the substrate over the trenches and the semiconductor material between the trenches, wherein a portion of the capacitor dielectric extends into the field oxide layer, between a first segment of the field oxide layer and a second segment of the field oxide layer, the first segment being located over the trench-fill material in each trench, and the second segment being located over the semiconductor material;

forming substrate contacts to the semiconductor material, in a region around the trenches, wherein no contacts to the semiconductor material are formed between the trenches; and forming trench contacts to the trench-fill material in each of the trenches.

12. The method of claim 11, wherein forming the capacitor dielectric includes:

forming an outer layer of silicon dioxide contacting the semiconductor material of the substrate;

forming a center layer including a silicon-nitrogen compound selected from a group consisting of silicon nitride and silicon oxynitride; and forming an inner layer of silicon dioxide contacting the trench-fill material.

13. The method of claim 12, wherein forming the outer layer of silicon dioxide includes a thermal oxidation process, and forming the center layer includes a chemical vapor deposition (CVD) process.

14. The method of claim 11, wherein forming the field oxide layer includes:

removing the semiconductor material from the substrate around the trenches and removing the trench-fill material in the trenches to form a shallow trench in the substrate and the trench-fill material, wherein a portion of the capacitor dielectric extends into the shallow trench;

forming a dielectric fill layer over the substrate, the dielectric fill layer extending into the shallow trench and surrounding the portion of the capacitor dielectric extending into the shallow trench; and removing the dielectric fill layer from over the substrate outside the shallow trench, leaving the dielectric fill layer in the shallow trench to provide the field oxide layer, the dielectric fill layer over the trench-fill material providing the first segment of the field oxide layer, and the dielectric fill layer over the semiconductor material providing the second segment of the field oxide layer.

15. The method of claim 14, further including:

forming a silicide blocking layer over the field oxide layer above the portion of the capacitor dielectric extending into the shallow trench; and forming a metal silicide layer on the trench contacts and on the substrate contacts, wherein the silicide blocking layer is free of the metal silicide layer.

16. The method of claim 15, wherein the silicide blocking layer contacts the portion of the capacitor dielectric extending into the field oxide layer.

17. The method of claim 15, wherein removing the semiconductor material to form the shallow trench leaves a portion of the semiconductor material of the substrate extending into the shallow trench along the portion of the capacitor dielectric extending into the shallow trench.

18. The method of claim 17, wherein the silicide blocking layer contacts the portion of the semiconductor material of the substrate extending into the field oxide layer.

19. The method of claim 15, wherein the trench-fill material includes polycrystalline silicon, and removing the semiconductor material to form the shallow trench leaves a portion of the polycrystalline silicon extending into the shallow trench along the portion of the capacitor dielectric extending into the shallow trench.

20. The method of claim 19, wherein the silicide blocking layer contacts the portion of the polycrystalline silicon extending into the field oxide layer.

* * * * *